United States Patent [19]
Carlson et al.

[11] Patent Number: 6,083,323
[45] Date of Patent: *Jul. 4, 2000

[54] METHOD FOR CONTROLLING THE TEMPERATURE OF THE WALLS OF A REACTION CHAMBER DURING PROCESSING

[75] Inventors: David K. Carlson, Santa Clara; Norma Riley, Pleasanton; Roger N. Anderson, San Jose, all of Calif.

[73] Assignee: Applied Materials, Inc., Santa Clara, Calif.

[*] Notice: This patent is subject to a terminal disclaimer.

[21] Appl. No.: 09/005,311

[22] Filed: Jan. 9, 1998

Related U.S. Application Data

[62] Division of application No. 08/831,797, Apr. 8, 1997, Pat. No. 5,855,677, which is a continuation of application No. 08/316,277, Sep. 30, 1994, abandoned.

[51] Int. Cl.$^7$ .............................. B08B 5/00; B08B 9/00
[52] U.S. Cl. .............................. 134/1; 134/19; 134/22.1; 438/905
[58] Field of Search ................... 134/1, 19, 21, 134/22.1; 438/905

[56] References Cited

U.S. PATENT DOCUMENTS

| | | | |
|---|---|---|---|
| 4,063,974 | 12/1977 | Fraas | 148/175 |
| 4,201,152 | 5/1980 | Luscher | 118/712 |
| 4,641,603 | 2/1987 | Miyazaki et al. | 118/724 |
| 5,053,247 | 10/1991 | Moore | 427/55 |
| 5,097,890 | 3/1992 | Nakao | 165/39 |
| 5,108,792 | 4/1992 | Anderson et al. | 427/248.1 |
| 5,158,644 | 10/1992 | Cheung et al. | 134/1 |
| 5,258,824 | 11/1993 | Carlson et al. | 356/382 |
| 5,305,417 | 4/1994 | Najm et al. | 392/418 |
| 5,346,555 | 9/1994 | Nunotani et al. | 118/724 |
| 5,584,963 | 12/1996 | Takahashi | 134/22.1 |
| 5,843,239 | 12/1998 | Shirotiya | 134/1 |
| 5,849,092 | 12/1998 | Xi et al. | 134/22.1 |
| 5,855,677 | 1/1999 | Carlson et al. | 118/666 |

FOREIGN PATENT DOCUMENTS

| | | |
|---|---|---|
| 0293021A3 | 11/1988 | European Pat. Off. . |
| 0382988 | 8/1990 | European Pat. Off. ............ 118/724 |
| 0467392A1 | 1/1992 | European Pat. Off. . |
| 0709488A1 | 5/1996 | European Pat. Off. . |
| 60-175414 | 9/1985 | Japan ............................ 118/724 |
| 60-175415 | 9/1985 | Japan ............................ 118/724 |
| 2-148717 | 6/1990 | Japan ............................ 118/724 |

OTHER PUBLICATIONS

Kirk–Othmer; Encyclopedia of Chemical Technology; John Wiley & Sons, vol. 9 (1980); pp. 768, 779.

Kirk–Othmer; Encyclopedia of Chemical Technology; John Wiley & Sons, vol. 22 (1983); pp. 679, 697–700.

*Primary Examiner*—Randy Gulakowski
*Assistant Examiner*—Saeed Chaudhry
*Attorney, Agent, or Firm*—Blakely Sokoloff Taylor & Zafman

[57] ABSTRACT

An apparatus and a concomitant method for controlling coolant (air) flow proximate a reaction chamber within a workpiece processing system such that the temperature of a wall of the reaction chamber is maintained at a predefined target temperature. The target temperature is typically a temperature that optimizes a process concurrently being accomplished within the chamber, e.g., utilizing one temperature during deposition processes and a different temperature during cleaning processes. The apparatus contains a temperature measuring device to measure the temperature of the chamber wall. The measured temperature is compared to the predefined target temperature. A closed loop system controls the air flow proximate the chamber walls such that the measured temperature becomes substantially equal to the target temperature. Air flow control is provided by an air flow control device located within an inlet conduit that supplies air to a shroud for channeling the air past the reaction chamber. The shroud forms a portion of a housing which supports and encloses the reaction chamber.

7 Claims, 4 Drawing Sheets

METHOD FOR CONTROLLING THE TEMPERATURE OF THE WALLS OF A REACTION CHAMBER DURING PROCESSING

This is a Divisional of application Ser. No. 08/831,797, filed Apr. 8, 1997 now U.S. Pat. No. 5,855,677, which is a Rule 62 Continuation of application Ser. No. 08/316,277, filed Sep. 30, 1994, now abandoned.

BACKGROUND OF THE DISCLOSURE

1. Field of the Invention

The invention relates to chemical vapor deposition (CVD) systems and, more particularly, to temperature control apparatus, and a concomitant method, for controlling the temperature of the walls of a CVD reaction chamber.

2. Description of the Prior Art

In a conventional chemical vapor deposition (CVD) system, a reaction chamber envelopes a volume wherein the deposition process occurs. The chamber typically is fabricated of transparent quartz. As such, the reaction chamber is said to have quartz windows (accessible surfaces of the chamber) through which the temperature of the apparatus within the chamber can be optically monitored using optical pyrometers. In general, since the windows are integral with the walls of the chamber, the temperature of these windows is indicative of the chamber wall temperature. The temperature of the windows and the walls of the chamber vary depending upon the temperature of the workpiece within the chamber, the process presently being accomplished, the gases involved in the current process, and the run time of the process.

More specifically, it is desirable that during a deposition process, the quartz wall temperature be controlled within a narrow temperature range to minimize deposits on the chamber wall. Furthermore, it is desirable that, during cleaning steps, the quartz wall temperature be maintained at a different temperature to maximize the etch rate of any film that may have been deposited on the chamber walls. Such temperature maintenance minimizes particulate contamination problems.

Typically, the temperature of the walls of the chamber is maintained at a nominal value by a flow of air proximate the outer surface of the chamber. This air flow is fixed for each process performed within the chamber. Thus, the temperature of the chamber walls varies with conditions within the chamber, e.g., the wall temperature differs depending on whether the process in the chamber is depositing material or etching material from a workpiece.

Through empirical study, it has been shown that the processes performed within the chamber can be optimized when the chamber wall temperature is maintained at an optimum temperature for a particular process. However, prior art CVD systems contemplate maintaining the air flow past the chamber at a fixed flow rate. As such, these systems exhibit significant chamber wall temperature variations which preclude a high degree of temperature optimization.

Therefore, a need exists in the art for closed loop apparatus, and a concomitant method, for controlling the air flow proximate a reaction chamber such that the temperature of the chamber walls can be readily optimized for each of the processes accomplished within the chamber.

SUMMARY OF THE INVENTION

The present invention overcomes the disadvantages heretofore associated with prior art CVD systems. Specifically, the present invention is an apparatus and a concomitant method for controlling coolant (air) flow proximate a reaction chamber within a CVD system such that the temperature of the walls of the reaction chamber is maintained at a predefined target temperature. The target temperature is typically a temperature that optimizes a process currently being accomplished within the chamber.

More specifically, the present invention uses an optical pyrometer (or thermocouple) to measure the temperature of a wall of the reaction chamber. The measured temperature is compared to the target temperature. A closed loop apparatus controls the air flow past the outer surface of the reaction chamber such that the measured temperature becomes substantially equal to the target temperature. Air flow control is provided by a positionable air vane located within an inlet conduit that supplies air to a shroud for channeling air past the reaction chamber. As such, positioning of the air vane regulates the air flow proximate the reaction chamber and, consequently, regulates the temperature of the reaction chamber walls.

In operation, a user can predefine a number of target temperatures that are optimal for particular processes to be performed within the chamber. The present invention adjusts the air flow to achieve and maintain each target temperature during an associated process. Consequently, an optimal reaction chamber wall temperature is used during each process.

BRIEF DESCRIPTION OF THE DRAWINGS

The teachings of the present invention can be readily understood by considering the following detailed description in conjunction with the accompanying drawings, in which.

FIG, 3 depicts a block diagram of circuitry used to provide a closed loop temperature control system.

To facilitate understanding, identical reference numerals have been used, where possible, to designate identical elements that are common to the figures.

DETAILED DESCRIPTION

Figure 1:
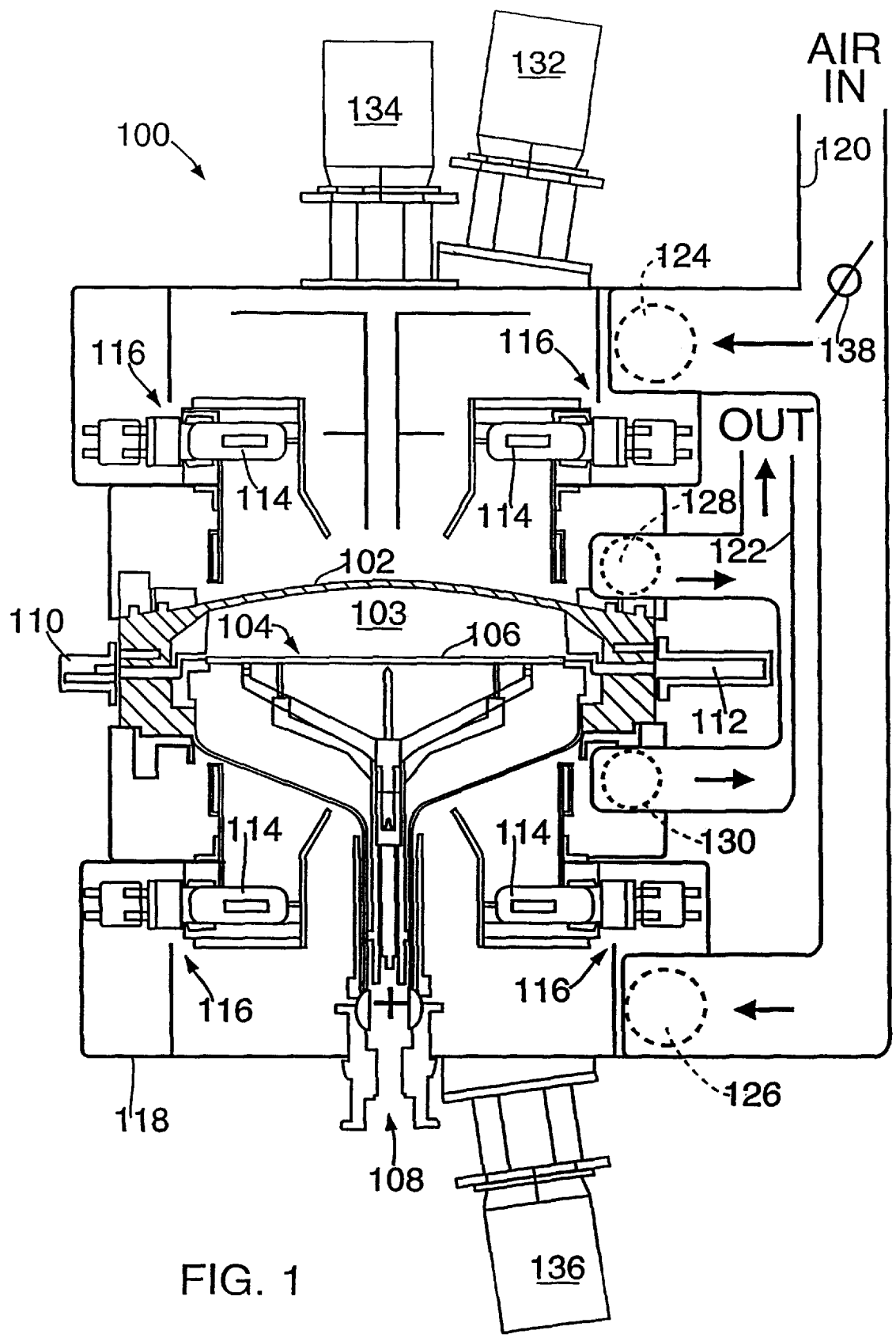
FIG. 1 shows a simplified cross-sectional view of a thermal reaction chamber containing an optical pyrometer for monitoring the temperature of a wall of the chamber.

FIG. 1 shows a cross-sectional view of a thermal reaction chamber 102 used in a chemical vapor deposition (CVD) system 100. The chamber has walls that define an inner volume 103 wherein the reactive CVD processes are accomplished. A housing 118 envelopes and supports the chamber 102. Within the inner volume 103 of chamber 102, a workpiece support structure 104 is used to support a workpiece 106 during CVD processing. Such workpiece support structures are generally referred to in the art as susceptors. The workpeice support structure 104 extends through a bottom aperture 108 of the chamber 102. Such an extension enables a drive assembly (not shown) to rotate the workpiece support structure 104, and thus the workpiece 106, during processing. Such rotation is accomplished to enhance process uniformity.

During processing, gases enter the chamber through an entry port 110 and are removed through an exhaust port 112.

Also during processing, heat is provided by infrared radiation bulbs 114. The infrared radiation bulbs are mounted, proximate the chamber, on a support assembly 116 connected to a housing 118. The walls of the chamber are transparent, allowing infrared radiation from the radiation bulbs to freely enter the reaction chamber and heat the workpiece.

A more complete description of thermal reactors and their operation is disclosed in commonly assigned U.S. Pat. No. 5,258,824 entitled "In-Situ Measurement Of A Thin Film Deposited On A Wafer" and U.S. Pat. No. 5,108,792 entitled "Double Dome Reactor for Semiconductor Processing", each of which is incorporated herein by reference.

During processing, the quartz windows (e.g., accessible portions of the transparent chamber walls), although transparent, still become heated. A coolant flow for cooling the chamber walls is supplied to the housing 118 from a blower (not shown) via inlet conduit 120, directed past the chamber and exhausted through outlet conduit 122. More specifically, the coolant flow is supplied via conduit 120 to housing 118 through upper and lower inlet ports 124 and 126. The coolant flow exits the housing 118 through upper and lower exhaust ports 128 and 130. The housing 118 forms a shroud that channels the coolant past the chamber walls. This constant flow of coolant proximate an outer surface of the chamber cools the walls of the chamber 102. Typically, the coolant is air. An air vane 138 or other coolant flow control device, located in the inlet conduit 120, controls the amount of air flow to the housing and, in turn, controls the temperature of the walls of the chamber. Alternatively, other devices for controlling the coolant flow may be used, such as an adjustable iris, a valve, blower speed control circuitry and the like.

The temperature of the quartz chamber walls is monitored using a conventional optical pyrometer 132. This optical pyrometer should be capable of measuring temperatures in the range of 100 degrees centigrade to 800 degrees centigrade and of detecting a wavelength of between 4.8 and 5.2 microns. Such an optical pyrometer is available from Ircon, Inc. having a business address of 7300 North Natchez Avenue, Niles, Ill. 60648, or from Linear Labs, having a business address of 1290 Hammerwood Avenue, Sunnyvale, Calif. 94089. Similar optical pyrometers are used to measure the temperature of the workpeice 106 (pyrometer 134) and to measure the temperature of the workpeice support structure 104 (pyrometer 136). These pyrometers should be able to measure a temperature range of 500 degrees centigrade to 1250 degrees centigrade and detect a wavelength of between two and four microns.

Figure 2:
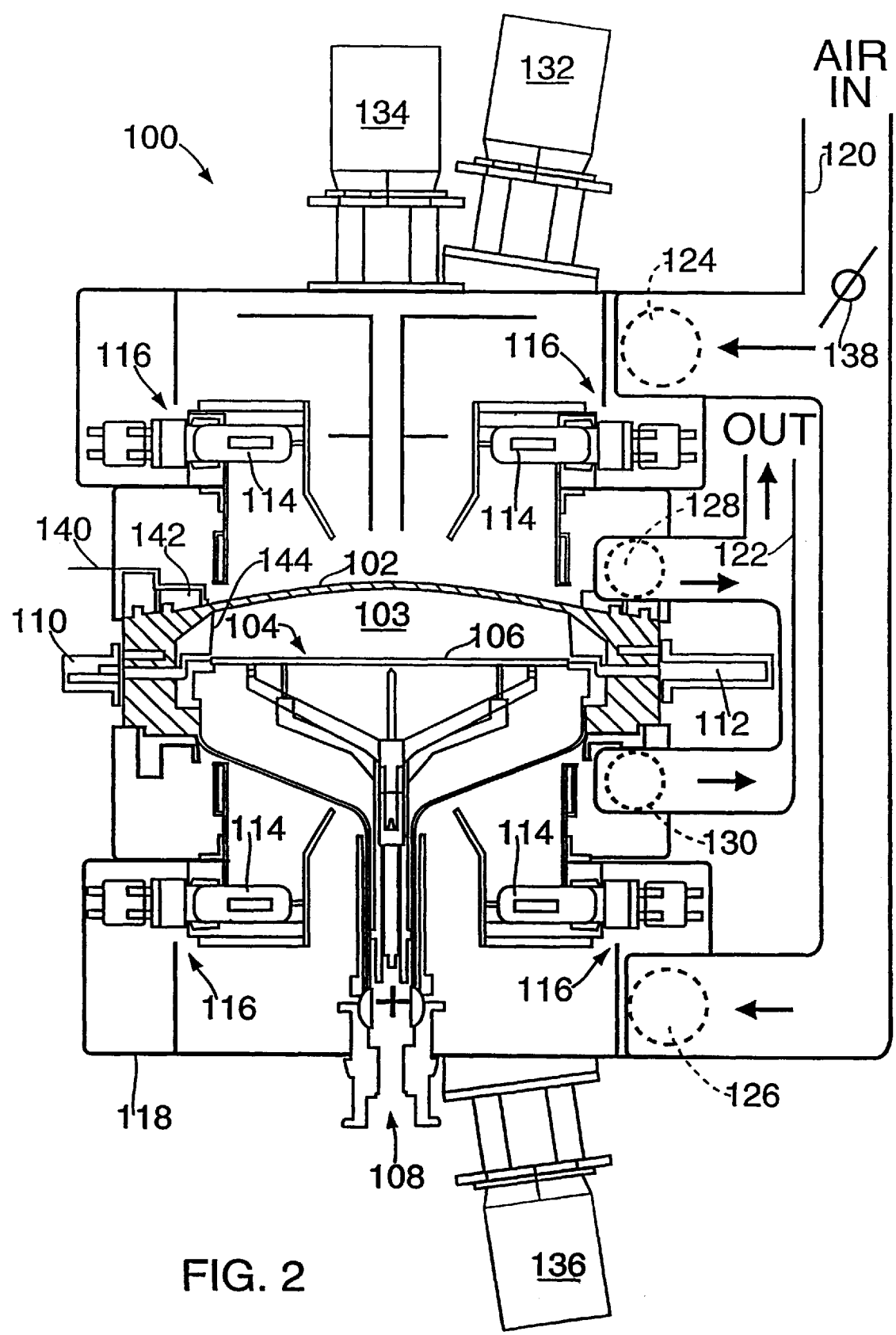
FIG. 2 shows a simplified cross-sectional view of a thermal reaction chamber containing a thermocouple for monitoring the temperature of a wall of the chamber.

Alternatively, other means of measuring the temperature of the reaction chamber walls could be used. One example of an alternative temperature measuring device, shown in FIG. 2, is a shielded thermocouple 140. The thermocouple 140 is attached directly to the outer surface of the reaction chamber 102. Specifically, the thermocouple 140 is mounted under a shield 142 and located directly above an upper quartz liner 144. As such, the temperature of the chamber wall is directly monitored and the thermocouple produces a signal indicative of the measured temperature.

An output signal from the optical pyrometer 132 (or thermocouple 140) is received and processed by signals processing circuitry (not shown). This circuitry may be as simple as a temperature display that converts the electrical output signal from the temperature measuring device into a display of the temperature value represented by the signal, e.g., a light emitting diode or liquid crystal numerical display. An operator, in response to the displayed temperature, manually adjusts the air flow control device such that the air flow across the reaction chamber is altered. In this manner, the operator can adjust the temperature of the chamber walls measured by the pyrometer (or thermocouple) until the measured temperature is equivalent to a target temperature as indicated on the display. Typically, the target temperature is a temperature that optimizes the present CVD process being accomplished within the chamber.

Figure 3:
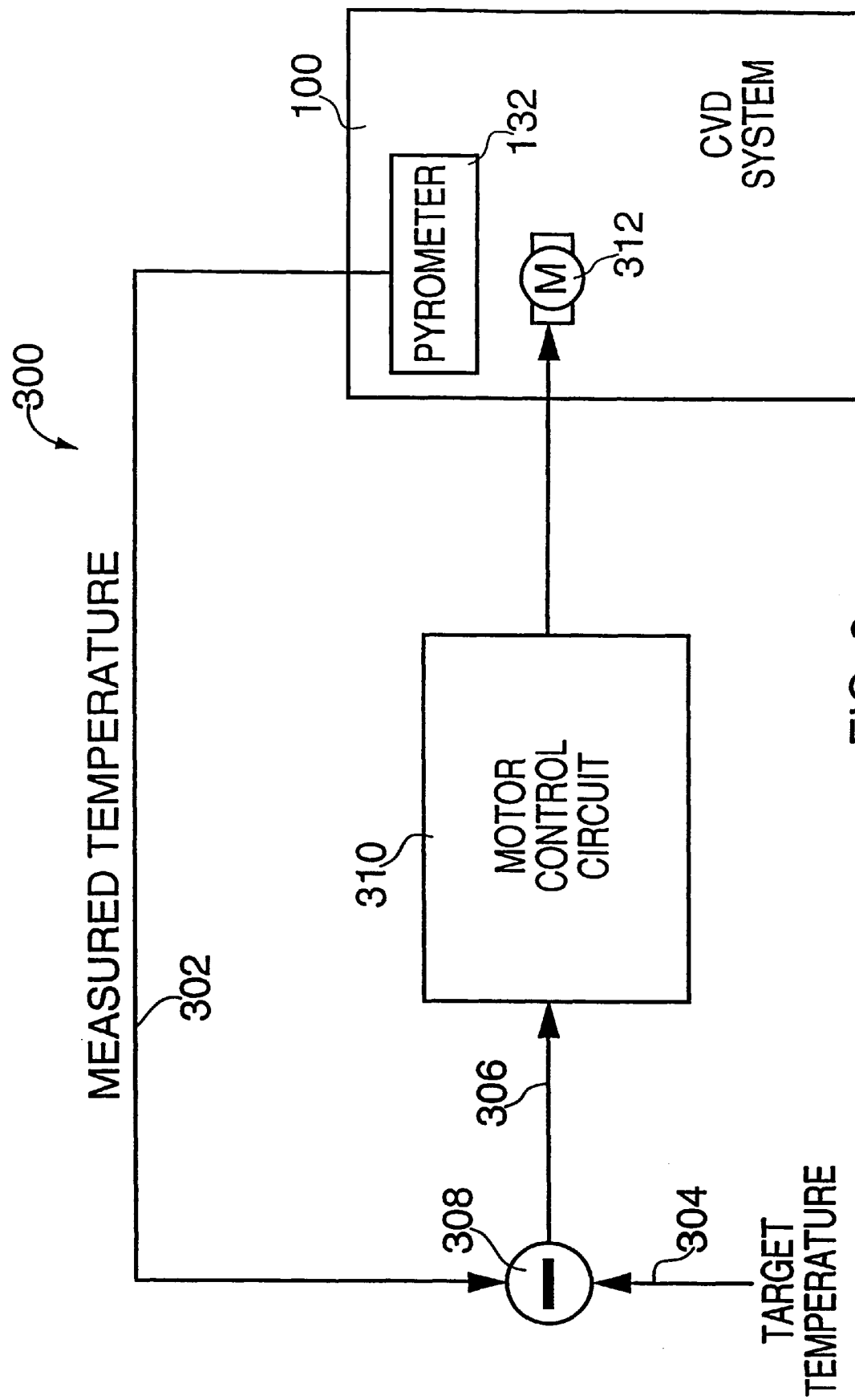
Figure 4:
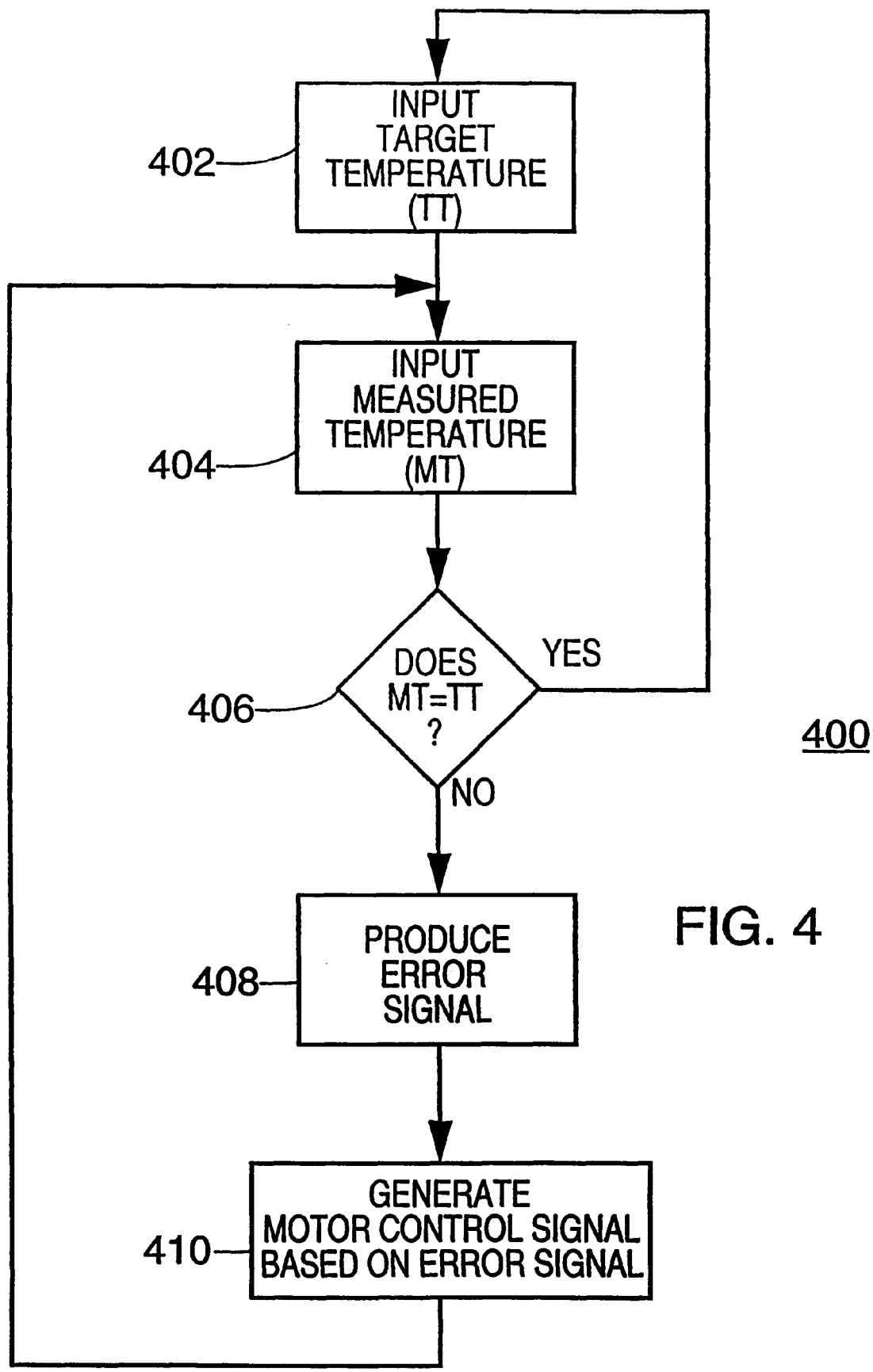
FIG. 4 depicts a flow chart of a closed loop control routine.

In the foregoing simple implementation of the invention, an operator forms a portion of the closed loop system controlling the measured temperature until attaining a target temperature. Using electrical circuitry, a closed loop circuit can be used to automate this closed loop. In that regard, FIG. 3 depicts a simplified block diagram of a closed loop system that controls the temperature of the chamber walls. FIG. 4 depicts a flow chart of a routine illustrating the process by which this closed loop system functions. To best understand the operation of this closed loop system, the reader should simultaneously refer to both FIGS. 3 and 4.

In this embodiment of the invention, the closed loop system 300 monitors a temperature signal (line 302) generated by the pyrometer 132 (or thermocouple), compares, using a subtractor 308, the measured temperature signal to a target temperature value (line 304), and generates an error signal (line 306) representing the difference between the target temperature and the measured temperature. The target temperature could be manually entered into the system or defined by a computer algorithm that is controlling the processing within the chamber. In any event, the error signal forms an input to a motor control circuit 310. The motor control circuit, in response to the error signal, controls a stepper motor 312 that adjusts the air vane. This air vane adjustment moves the air vane such that the error signal is minimized. This entire operation is performed at timed intervals to minimize the error signal and counteract any variation in wall temperature. Consequently, the quartz wall temperature is adjusted to equal the target temperature.

The process involved in this closed loop control of the chamber wall temperature is summarized in the flow chart of FIG. 4. At step 402, the target temperature (TT) is input to the system. At step 404, the measured temperature (MT) is generated by the pyrometer (or thermocouple). At step 406, the routine queries whether the target temperature is equal to the measured temperature. If the temperatures are equal, the routine loops, along YES path 412, to the beginning of the routine and repetitively measures and compares the target and measured temperatures until the query is negatively answered.

If the target and measured temperatures are not equal, the routine proceeds along the NO path emanating from step 406 to step 408. At step 408, the routine produces an error signal by subtracting the measured temperature from the target temperature. At step 410, the motor control circuit generates, in response to the error signal, an appropriate motor control signal. This motor control signal activates the stepper motor and adjusts the position of the air vane. By repeating this routine, the system adjusts the air flow until the target and measured temperatures are equal. Subsequently, the routine continuously monitors the measured temperature and continuously adjusts the air vane position to maintain the measured temperature at the target temperature.

Using this method and system, the temperature of the chamber walls can be set to a target temperature that optimizes the CVD process presently occurring in the chamber. The same system and method maintains that target temperature throughout the process. Subsequently, for other processes, other target temperatures can be selected, established and maintained by the invention.

From the foregoing disclosure, those skilled in the art should realize that the error signal can be used to control other forms of air flow control devices such as blower speed, air valves, adjustable irises, and the like. Additionally, the disclosed routine can be implemented as a software program executed upon a microprocessor (computer) that controls the CVD processing. As such, the microprocessor produces the signals that control the air flow control device.

Although various embodiments which incorporate the teachings of the present invention have been shown and described in detail herein, those skilled in the art can readily devise many other varied embodiments that still incorporate these teachings.

What is claimed is:

1. A method of cleaning a process chamber, said method comprising the steps of:

providing heat to a processing chamber having chamber walls during a cleaning process;

providing a coolant flow proximate to the outer surface of said chamber walls;

monitoring the temperature of said chamber walls; and adjusting said coolant flow over said chamber walls so that said chamber walls obtain a temperature which optimizes the cleaning of said chamber walls by said cleaning process.

2. A method of cleaning a processing chamber, said method comprising the steps of:

providing heat to a processing chamber having chamber walls during a cleaning process;

providing a coolant flow proximate to the outer surface of said chamber walls;

providing a target temperature for said chamber walls, wherein said target temperature is a temperature which optimizes the cleaning of said chamber walls by said cleaning process;

monitoring the temperature of said chamber walls;

utilizing said monitored temperature of said chamber walls and said target temperature of said chamber walls to adjust said coolant flow so that said chamber walls obtain said target temperature; and removing a film from said chamber walls with said cleaning process.

3. The method of claim 1 wherein said chamber walls are quartz.

4. The method of claim 2 wherein said temperatures of said chamber walls are monitored utilizing an optical pyrometer having a detection wavelength of at least 4.8 microns.

5. The method of claim 1, wherein said chamber wall temperature is monitored using a shielded thermocouple.

6. A method of processing a substrate, said method comprising the steps of:

depositing a film on a substrate in a processing chamber having chamber walls;

while depositing said film, controlling the amount of a coolant which flows over said chamber walls so that said chamber walls achieve a first temperature, wherein said temperature is sufficiently low to prevent substantial film deposition on said chamber walls;

removing said substrate from said chamber;

cleaning said chamber with a cleaning process; and while cleaning said chamber controlling the amount of said coolant which flows over said chamber walls so that said chamber walls obtain a second temperature which optimizes the removal of a film from said chamber walls by said cleaning process.

7. A method of processing a semiconductor wafer, said method comprising the steps of:

placing a wafer a deposition chamber having chamber walls;

providing a coolant flow proximate the outer surface of said chamber walls;

heating said wafer to a deposition temperature to enable a film to be deposited on said substrate;

providing a first target temperature for said chamber walls, wherein said first target temperature is a temperature low enough to substantially reduce the amount of a film which deposits on said chamber walls;

depositing said film on said wafer;

providing a first chamber wall temperature during said film deposition;

comparing said first target temperature and said first chamber wall temperature;

adjusting said coolant flow in response to said comparison of said first target temperature and said first chamber wall temperature so that said wall temperature equals said first target temperature;

removing said substrate;

providing a second target temperature, said second target temperature greater than said first target temperature, and to optimize a cleaning process to etch said film formed on said chamber walls;

providing a second chamber wall temperature while cleaning said chamber;

comparing said second chamber wall temperature with said second target temperature;

adjusting said coolant flow in response to said comparison of said second wall temperature and said second target temperature so that said wall temperature equals said second target temperature; and removing deposits from said chamber wall with said cleaning process.

* * * * *